(12) United States Patent
Park et al.

(10) Patent No.: US 8,994,136 B2
(45) Date of Patent: Mar. 31, 2015

(54) DIGITAL SILICON PHOTOMULTIPLIER DETECTOR CELLS

(71) Applicant: Samsung Electronics Co., Ltd., Suwon-si (KR)

(72) Inventors: Jae-chul Park, Suwon-si (KR); Young Kim, Yongin-si (KR); Chae-hun Lee, Suwon-si (KR); Yong-woo Jeon, Seoul (KR); Chang-jung Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/017,787

(22) Filed: Sep. 4, 2013

(65) Prior Publication Data

US 2014/0210035 A1   Jul. 31, 2014

(30) Foreign Application Priority Data

Jan. 28, 2013   (KR) .................... 10-2013-0009452

(51) Int. Cl.
| | | |
|---|---|---|
| *H01L 31/105* | (2006.01) | |
| *H01L 21/00* | (2006.01) | |
| *H01L 31/103* | (2006.01) | |
| *H01L 27/144* | (2006.01) | |

(52) U.S. Cl.
CPC ............ *H01L 31/105* (2013.01); *H01L 31/103* (2013.01); *H01L 27/1446* (2013.01)
USPC .......................................... 257/438; 438/91

(58) Field of Classification Search
CPC .............. H01L 31/103; H01L 31/1075; H01L 31/02027; H01L 27/14649; H01L 27/13643; H01L 27/14601; H01L 31/105; H01L 27/1446; H01L 27/14603
USPC ........ 257/438, 461, 186, 458; 438/91, 73, 57, 438/87

See application file for complete search history.

(56) References Cited

U.S. PATENT DOCUMENTS

| 7,714,292 B2 | 5/2010 | Agarwal et al. |
| 8,193,815 B2 | 6/2012 | Prescher et al. |
| 8,217,436 B2 * | 7/2012 | Henderson et al. ........... 257/292 |

(Continued)

FOREIGN PATENT DOCUMENTS

| KR | 20090061307 A | 6/2009 |
| KR | 20090129123 A | 12/2009 |
| KR | 20110131008 A | 12/2011 |

OTHER PUBLICATIONS

Neamen, "Semiconductor physics and devices: basic principles", 1994, Richard D. Irwin, Inc., p. 151.*

*Primary Examiner* — Nikolay Yushin
(74) *Attorney, Agent, or Firm* — Harness, Dickey & Pierce, P.L.C.

(57) ABSTRACT

A silicon photomultiplier detector cell may include a photodiode region and a readout circuit region formed on a same substrate. The photodiode region may include a first semiconductor layer exposed on a surface of the silicon photomultiplier detector cell and doped with first type impurities; a second semiconductor layer doped with second type impurities; and/or a first epitaxial layer between the first semiconductor layer and the second semiconductor layer. The first epitaxial layer may contact the first semiconductor layer and the second semiconductor layer. The first epitaxial layer may be doped with the first type impurities at a concentration lower than a concentration of the first type impurities of the first semiconductor layer.

19 Claims, 8 Drawing Sheets

(56) References Cited

U.S. PATENT DOCUMENTS

2010/0127314 A1* 5/2010 Frach .......................... 257/292
2011/0278466 A1 11/2011 Frach et al.

* cited by examiner

DIGITAL SILICON PHOTOMULTIPLIER DETECTOR CELLS

CROSS-REFERENCE TO RELATED APPLICATION(S)

This application claims priority from Korean Patent Application No. 10-2013-0009452, filed on Jan. 28, 2013, in the Korean Intellectual Property Office (KIPO), the entire contents of which are incorporated herein by reference.

BACKGROUND

1. Field

Some example embodiments may relate generally to silicon photomultiplier detector cells. Some example embodiments may relate to silicon photomultiplier detector cells that use digital signals.

2. Description of Related Art

Examples of techniques of imaging the inside of a human body include positron emission tomography (PET), magnetic resonance imaging (MRI), and X-ray computed tomography (CT). PET is a nuclear medicine imaging method in which an emitted positron is detected using radiopharmaceuticals to show physiological, pathological images of a human body. In PET, an analogue of glucose called F-18-FDG, which is a radioactive isotope, is injected into a body, and radiation produced due to a reaction between the analogue of glucose and a cancer existing in the body is detected after the lapse of a certain period of time (for example, several tens of minutes) to obtain information about the position of the cancer. A detector that detects a radiation produced due to a reaction between an analogue of glucose and a cancer in a body is referred to as a silicon photomultiplier detector or a gamma ray detector. Apparatuses for detecting radiation or gamma rays may be applied not only to radiation detectors for single photon emission CT (SPECT), CT, and the like, but also to various fields such as astronomy.

PET apparatuses are medical imaging apparatuses that inject radiopharmaceuticals for emitting positrons into a living body via an intravenous injection or intake, measure gamma rays produced due to positron annihilation by using a circular ring-shaped detector that surrounds the living body, and calculate the distribution of a positron-emitting nuclide within the body via a computer to thereby produce and show an image of the distribution. A photomultiplier tube (PMT) has been used as the detector.

PET has recently been incorporated with MRI, which provides anatomical information. In this case, a PMT causes distortion of an electrical signal under a strong magnetic field of MRI. Thus, there is a demand for a detector that is strong against the strong magnetic field of MRI, and a silicon photomultiplier (SiPM) detector has been proposed.

The SiPM detector may be roughly broken down into a scintillator, a pixel, and readout electronics. The scintillator transforms high-energy gamma rays of 511 keV into low-energy photons having a wavelength of 400 nm to 450 nm. Since a gamma ray is a very large energy photon, it is not absorbed by silicon but is mostly transmitted by the silicon. Thus, the scintillator transforms the gamma ray to have a wavelength band that can be absorbed by silicon. The pixel transforms an optical signal into an electrical signal by absorbing the photon obtained from the scintillator.

The pixel may be an analog type or a digital type. Each analog type pixel includes several thousands of microcells, each of which includes a single avalanche photodiode (APD) and a resistor. A signal of a microcell is turned on or off depending on whether a photon is incident upon the microcell. Thus, the intensity of a pixel signal is determined by summing all of the electrical signals generated by the microcells. The pixel signal is transformed into a digital signal for use in calculations of energy and time by the readout electronics. On the other hand, in a digital type pixel, some of application specific integrated circuits (ASICs) on a printed circuit board (PCB) of analog type pixels are implemented within a microcell. Thus, digital type pixels provide improved time resolution and improved energy resolution compared to analog type pixels. However, the time resolution and the energy resolution of SiPM still need to be further increased.

SUMMARY

Some example embodiments may provide silicon photomultiplier detector cells capable of increasing photo detection efficiency.

Some example embodiments may provide methods of fabricating silicon photomultiplier detector cells capable of increasing photo detection efficiency.

In some example embodiments, a silicon photomultiplier detector cell may include a photodiode region and a readout circuit region formed on a same substrate. The photodiode region may comprise: a first semiconductor layer exposed on a surface of the silicon photomultiplier detector cell and doped with first type impurities; a second semiconductor layer doped with second type impurities; and/or a first epitaxial layer between the first semiconductor layer and the second semiconductor layer. The first epitaxial layer may contact the first semiconductor layer and the second semiconductor layer. The first epitaxial layer may be doped with the first type impurities at a concentration lower than a concentration of the first type impurities of the first semiconductor layer.

In some example embodiments, a concentration of the second type impurities of the second semiconductor layer may be greater than the concentration of the first type impurities of the first semiconductor layer.

In some example embodiments, the silicon photomultiplier detector cell may further comprise a second epitaxial layer between the same substrate and the second semiconductor layer. The second epitaxial layer may be doped with the first type impurities at a concentration lower than the concentration of the first type impurities of the first semiconductor layer.

In some example embodiments, the concentration of the first type impurities of the second epitaxial layer may be equal to the concentration of the first type impurities of the first epitaxial layer.

In some example embodiments, the same substrate may be a silicon layer doped with the first type impurities.

In some example embodiments, a trench extending from a surface of the silicon photomultiplier detector cell to the same substrate may be formed between the photodiode region and the readout circuit region.

In some example embodiments, the trench may be filled with material configured to reduce or prevent optical crosstalk.

In some example embodiments, the trench may be filled with at least one of polysilicon and metal.

In some example embodiments, a first insulation film may be formed on a sidewall of the trench.

In some example embodiments, the silicon photomultiplier detector cell may further comprise the first type impurities may be p-type impurities, and/or the second type impurities may be n-type impurities.

In some example embodiments, the silicon photomultiplier detector cell may further comprise a contact layer between the trench and the first epitaxial layer. The contact layer may contact the second semiconductor layer.

In some example embodiments, the contact layer may be doped with the second type impurities at a concentration lower than the concentration of the second type impurities of the second semiconductor layer.

In some example embodiments, the silicon photomultiplier detector cell may further comprise a second insulation film between the first semiconductor layer and the contact layer.

In some example embodiments, a method of fabricating a silicon photomultiplier detector cell including a photodiode region and a readout circuit region formed on a same substrate may comprise, in order to form the photodiode region: forming a first semiconductor layer doped with first type impurities on a first layer; forming, via epitaxial growth, a second layer doped with the first type impurities on the first semiconductor layer; and/or forming a second semiconductor layer doped with second type impurities on the first layer.

In some example embodiments, the method may further comprise forming the second layer doped with the first type impurities on the same substrate.

In some example embodiments, the method may further comprise forming a trench that exposes the same substrate, by etching the first layer and the second layer, after forming the second layer.

In some example embodiments, the method may further comprise forming a first insulation film on a sidewall of the trench; and/or filling the trench with material configured to reduce or prevent optical crosstalk.

In some example embodiments, the material that reduces or prevents optical crosstalk may comprise at least one of polysilicon and metal.

In some example embodiments, the material that reduces or prevents optical crosstalk may comprise polysilicon.

In some example embodiments, the material that reduces or prevents optical crosstalk may comprise metal.

In some example embodiments, the method may further comprise forming a contact layer, doped with the first type impurities, in parts of the second layer that contact the trench.

In some example embodiments, the method may further comprise forming an insulation film configured to insulate the first semiconductor layer from the contact layer, before forming the second semiconductor layer.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
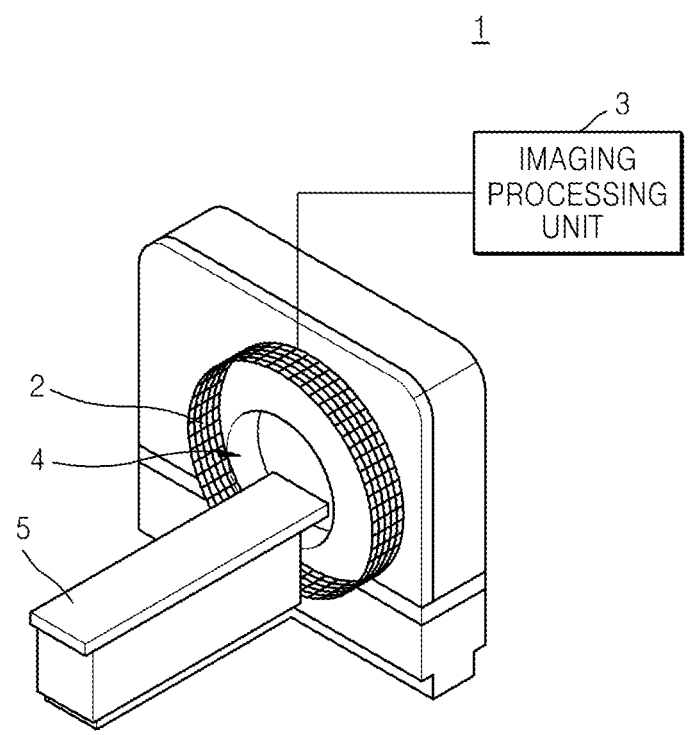
FIG. 1 is a perspective view of a radiation measuring device according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a perspective view of a radiation measuring device 1 according to some example embodiments.

Referring to FIG. 1, the radiation measuring device 1 may include a plurality of radiation measuring modules 2, an imaging processing unit 3, and an imaging zone 4.

The imaging zone 4 is a zone that accommodates an object, and is provided to measure an image of the object. To fix the object, a supporter 5 may be included in the imaging zone 4. The radiation measuring modules 2 may receive a radiation from the object and convert the radiation into a detection signal. The radiation measuring modules 2 may include a plurality of radiation detecting modules. Such a radiation detecting module will be described later in detail. The imaging processing unit 3 may produce an image of the object, based on the detect signal produced by the radiation measuring modules 2.

Figure 2:
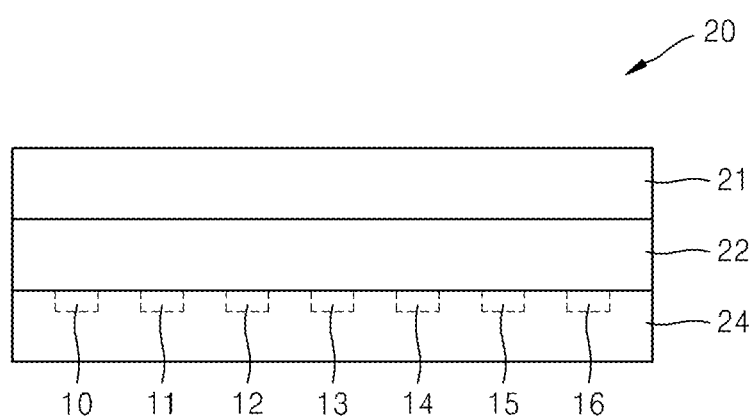
FIG. 2 is a cross-sectional view of a radiation detecting module according to some example embodiments.

FIG. 2 is a cross-sectional view of a radiation detecting module 20 according to some example embodiments.

Referring to FIG. 2, the radiation detecting module 20 may include a scintillator 21, an optical pipe 22, pixel elements 10, 11, 12, 13, 14, 15, and 16, and a semiconductor chip 24.

The scintillator 21 may receive radiation (for example, a gamma ray) and produce a photon. The optical pipe 22 may be disposed between the scintillator 21 and the semiconductor chip 24, and may deliver the photon produced by the scintillator 21 to the semiconductor chip 24. The direction in which the photon is incident upon the semiconductor chip 24 does not limit the scope of the present invention. For example, the photon may be incident upon the semiconductor chip 24 via an upper surface of the scintillator 21 or via a bottom surface of the semiconductor chip 24. In the latter case, the semiconductor chip 24 may be formed of a material capable of transmitting the photon.

The semiconductor chip 24 may include the pixel elements 10, 11, 12, 13, 14, 15, and 16, which are arranged in an array shape, in order to receive the photon via the optical pipe 22 and convert the photon into a corresponding electrical signal.

Each of the pixel elements 10, 11, 12, 13, 14, 15, and 16 may include detector cells 100, which will be described later.

For example, when each pixel element includes 16 detector cells 100 and pixel elements are formed in a 7×7 array shape in the semiconductor chip 24, a total of 7×7×16 (=784) detector cells 100 may be formed in the semiconductor chip 24. Each detector cell 100 may be generally expressed as a microcell. If each microcell (for example, each detector cell 100) includes 2 photodiodes, 7×7×16×2 (=1568) photodiodes may be implemented in the single semiconductor chip 24.

Figure 3:
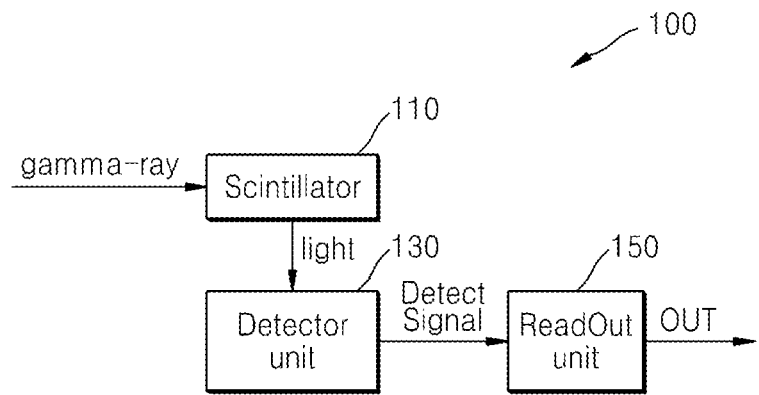
FIG. 3 is a block diagram of a detector cell included in a silicon photomultiplier according to some example embodiments.

FIG. 3 is a block diagram of a detector cell 100 included in a silicon photomultiplier according to some example embodiments.

Referring to FIG. 3, the detector cell 100 may include a scintillator 110, a detector unit 130, and a readout unit 150.

The silicon photomultiplier according to some example embodiments includes a pixel element including at least 500 microcells, each of which has a size of about 20 micrometers. Each microcell independently detects and amplifies photons. When a photon enters each microcell and forms a hole pair together with an electron, an electrical signal corresponding to the hole pair is amplified by an electric field within the silicon photomultiplier, and a signal having a certain magnitude is produced and output. In this case, an output signal of the silicon photomultiplier may be a signal corresponding to a sum of the signals of all of the microcells.

The scintillator 110 receives radiation to produce a photon. In other words, a radioactive isotope (for example, F-18-FDG) injected into a patient or a to-be-scanned target undergoes a radioactive decay event. In the radioactive decay event, a positron is produced. The positron produced in the radioactive decay event interacts with a neighboring electron to cause an electron-positron annihilation event. In the electron-positron annihilation event, two oppositely-directed radiations each having a 511 keV energy are produced. The two radiations move at the speed of light. When the two radiations collide with the scintillator 110, light (or a photon) is generated. In this case, the light generated by the scintillator 110 may be visible light. In more detail, the light generated by the scintillator 110 may be visible light having a wavelength of about 400 nm to about 450 nm. In this case, the material of the scintillator 110 may be lutetium oxyorthosilicate (LSO), lutetium yttrium oxyorthosilicate (LYSO), mixed lutetium silicate (MLS), lutetium gadolinium oxyorthosilicate (LGSO), lanthanum bromide (LaBr), or a combination thereof. However, the material of the scintillator 110 is not limited thereto, and any other scintillator material may be used.

The detector unit 130 receives the light (or photon) from the scintillator 110 to generate a detect signal. The detect signal may be a digitized electrical signal. For example, when the detector unit 130 receives no light, the detect signal has a first digital value. On the other hand, when the detector unit 130 receives light, the detect signal has a second digital value. The detector unit 130 may include a photodiode. The photodiode receives light to generate an electrical signal. The electrical signal is an analog signal, and may be converted into a digital signal after undergoing passive/active quenching and active resetting.

Figure 4:
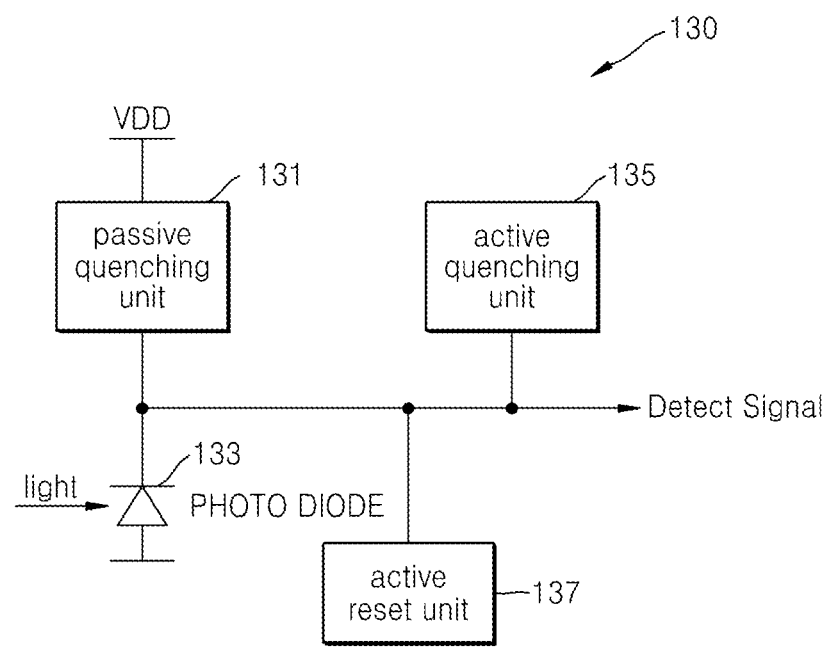
FIG. 4 is a circuit diagram of a detailed structure of a detector unit included in the detector cell illustrated in FIG. 3.

FIG. 4 is a circuit diagram of a detailed structure of the detector unit 130.

Referring to FIG. 4, the detector unit 130 includes a photodiode 133, a passive quenching unit 131, an active quenching unit 135, and an active reset unit 137.

The photodiode 133 may produce a current based on the photon generated by the scintillator 110. The detector unit 130 may include a plurality of photodiodes 133, each of which may be included in each of a plurality of microcells.

For example, the photodiode 133 may be an avalanche photodiode. A supply voltage VDD, which is slightly lower than an operational voltage of the photodiode 133 (for example, a breakdown voltage when the photodiode 133 is an avalanche photodiode), may be applied. In this case, when the photodiode 133 receives a photon, the operational voltage of the photodiode 133 becomes less than or equal to the supply voltage VDD. Accordingly, a current flows in the photodiode 133.

When the current flows in the photodiode 133, a voltage difference is generated between both ends of the passive quenching unit 131. The passive quenching unit 131 may be, for example, a resistor and an equivalent circuit. Due to a voltage drop caused by the passive quenching unit 131, the magnitude of a voltage applied to the photodiode 133 is reduced. For example, if the passive quenching unit 131 includes a resistor and an equivalent circuit, the larger the magnitude of the current flowing in the photodiode 133 is, the larger the voltage drop in the passive quenching unit 131. Accordingly, as the current flowing in the photodiode 133 increases, the voltage applied to the photodiode 133 decreases, because the voltage between both ends of the passive quenching unit 131 increases although the supply voltage VDD is constant. Consequently, while the current flowing in the photodiode 133 is increasing, and at some point a voltage that is lower than the operating voltage of the photodiode 133 is applied on the photodiode 133. Therefore, the flow of the current generated when the photodiode 133 receives the photons is stopped by the passive quenching unit 131.

The active quenching unit 135 shortens the time taken for the passive quenching unit 131 to prevent a current to flow again. In other words, when the passive quenching unit 131 maintains a voltage between both ends of the photodiode 133 as the operational voltage of the photodiode 133, the active quenching unit 135 shortens the time taken for the voltage between both ends of the photodiode 133 to be changed from the supply voltage VDD to the operational voltage of the photodiode 133. Accordingly, the time taken to recover the photodiode 133 may be reduced, and the resolution of the detector unit 130 may be increased.

When the reception of the light (or photon) is suspended, the voltage between both ends of the photodiode 133 is restored to the supply voltage VDD. The active reset unit 137 shortens the time taken to perform this restoration. The shortening of the restoration period of time may enable next light (or photon) to be detected when being received. In other words, when the restoration period of time increases, the current light is not distinguished from next light (or photon), and thus the two receptions of light may be recognized as a one-time reception. Therefore, energy resolution decreases. Accordingly, the inclusion of the active reset unit 137 may shorten the restoration period of time and increase energy resolution.

In an operation of the detector unit 130, the photodiode 133 enables a current to flow via the light (photon) received from the scintillator 110. At this time, the voltage between both ends of the photodiode 133 is adjusted to the level of the operational voltage of the photodiode 133 by the passive quenching unit 131, and the time taken for the voltage of the photodiode 133 to be changed is reduced by the active quenching unit 135.

Referring back to FIG. 3, the readout unit 150 receives the detect signal to generate an output signal OUT. The output signal OUT is not stored in a buffer or a special memory, and the output signal OUT is generated in response to the detect signal. The output signal OUT is transmitted to an external circuit (for example, a radiation calculator) of the silicon photomultiplier detector cell 100.

An operation of the silicon photomultiplier detector cell 100 according to some example embodiments will now be described. A radioactive isotope injected into a patient or a to-be-scanned target generates gamma rays via a radioactive decay events. The scintillator 110 receives the gamma rays to produce the light (or photons). The detector unit 130 receives the light (or photons) from the scintillator 110 to generate the detect signal. The readout unit 150 receives the detect signal from the detector unit 130 and generates an output signal OUT having a format receivable by an external circuit, without storing or counting the detect signal separately. The output signal OUT is transmitted to the external circuit.

Accordingly, the silicon photomultiplier according to some example embodiments receives the detect signal and generates the output signal OUT at the same time, and transmits the output signal OUT to the external circuit, without storing the detect signal in the detector cell 100 (or a microcell). Accordingly, a space occupied by internal memory or a buffer is not necessary, leading to a reduction in the size of the silicon photomultiplier and execution of integration. The silicon photomultiplier according to some example embodiments may increase a fill factor. The fill factor represents a percentage of the area of a detecting portion in a detector cell. For example, the fill factor may be increased to at least 65%.

Since the energy resolution of the detector cell 100 does not rely on the capacity of internal memory or a buffer but relies on the capacity of the memory of the external circuit, a high energy, resolution detector cell may be obtained. In detail, a Full Width at Half Maximum (FWHM), representing energy resolution, of the silicon photomultiplier according to some example embodiments may be reduced to 10% or less.

An energy dynamic range may be represented as a product of the number of detector cells 100 (or microcells) and the capacity of memory capable of storing the detect signal generated by each of the detector cells 100. The energy resolution of the detector cell 100 does not rely on the capacity of internal memory, but relies on the capacity of external memory. The capacity of the internal memory is limited by the size of the detector cell 100, whereas the capacity of the external memory may be relatively large. Therefore, the energy dynamic range may increase in proportion to the capacity of the external memory.

Figure 5A:
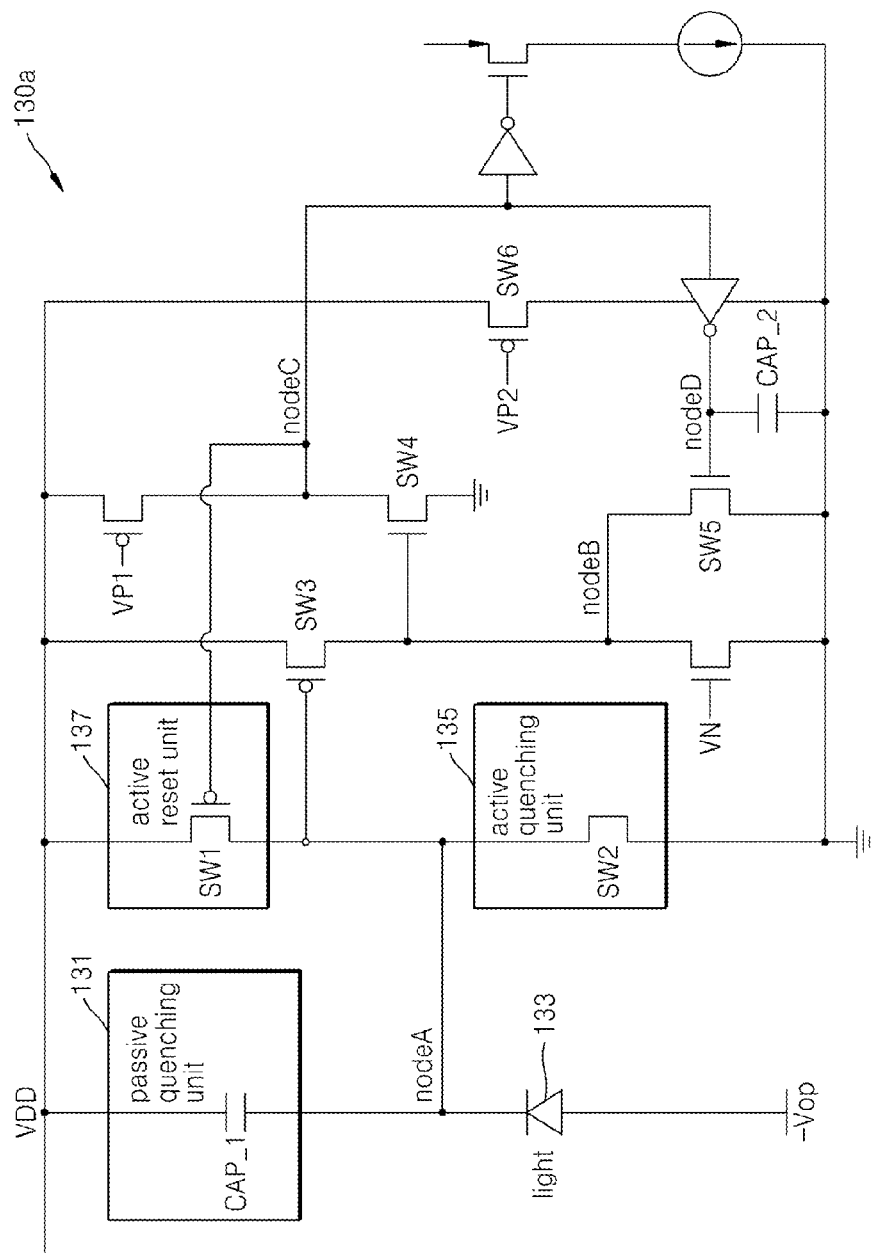
FIG. 5A is a circuit diagram of a detector unit according to some example embodiments.
Figure 5B:
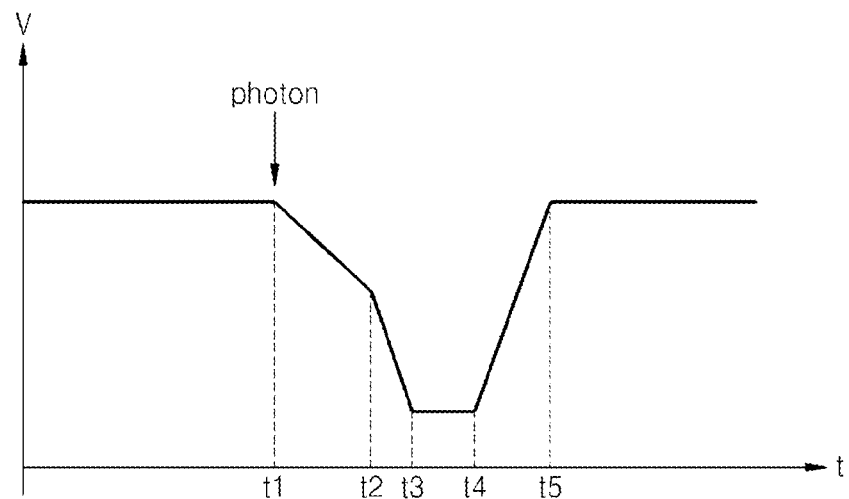
FIG. 5B is a timing diagram of voltage versus time for a voltage between both ends of a photodiode included in the detector unit of FIG. 5A.

FIG. 5A is a circuit diagram of a detector unit 130a according to some example embodiments, and FIG. 5B is a timing diagram of voltage versus time for a voltage between both ends of the photodiode 133 included in the detector unit 130a of FIG. 5A.

Referring to FIG. 5A, the active quenching unit 135 may include a switch transistor SW2. The active reset unit 137 may include a switch transistor SW1. The passive quenching unit 131 may include a capacitor CAP_1. FIG. 5A also shows first reference voltage VP1, second reference voltage VP2, third reference voltage VN, and fourth reference voltage −Vop.

Referring to FIGS. 5A and 5B, when light (or photon) is received by the photodiode 133 at a point of time t1, current flows in a node A, and a voltage between both terminals of the photodiode 133 decreases. In other words, the voltage at the node A decreases, and a low voltage is applied to the node A. In other words, passive quenching occurs. Accordingly, when a switch transistor SW3 is turned on, the supply voltage VDD is applied to a node B, and thus the node B is high and the switch transistor SW2 and a switch transistor SW4 are turned on. Therefore, the voltage of the node A drastically decreases between a point of time t2 and a point of time t3. In other words, active quenching occurs. When the switch transistor SW4 is turned on, the voltage of a node C decreases, and thus the node C is in a low state. Thus, the switch transistor SW1 is turned on. Therefore, the voltage of the node A stays constant between the point of time t3 and a point of time t4. Since the node C is in a low state, a voltage of a node D is high. However, the time taken for the voltage of the node D to become high since the node C is in a low state is adjustable by a switch transistor SW6 and a capacitor CAP_2. Accordingly, the node C is in a low state, a switch transistor SW5 is turned on after a lapse of a certain period of time, and thus the voltage of the node B becomes low. Therefore, the switch transistor SW2 is turned off, and the voltage of the node A returns to the supply voltage VDD between the point of time t4 and a point of time t5. In other words, active resetting occurs.

In the detector unit 130a, the speed at which the node A enters into a low state may increase according to the photo detection efficiency of the photodiode 133, and a weak photon may be incident without difficulties. A photodiode having improved photo detection efficiency will now be described.

Figure 6:
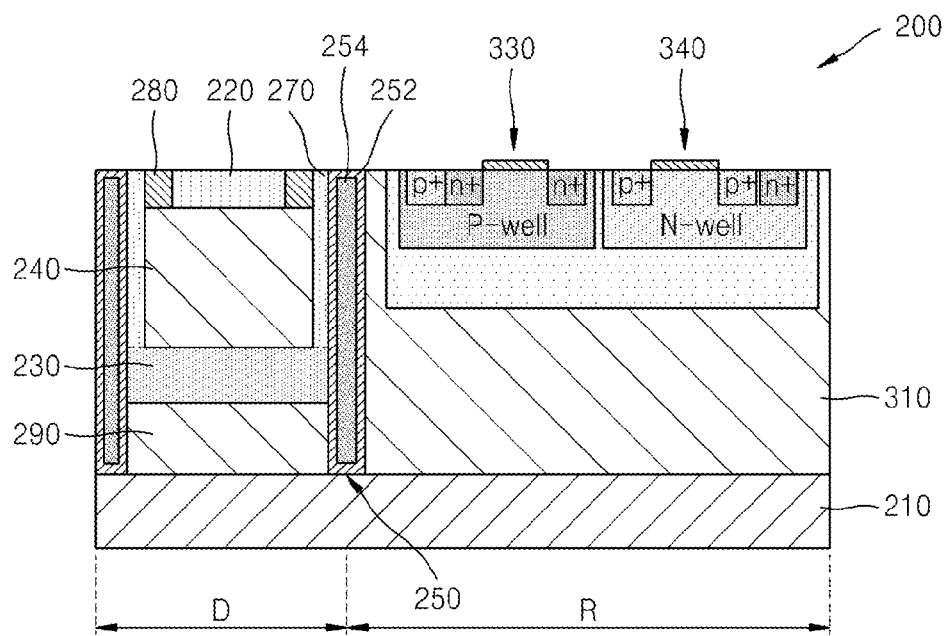
FIG. 6 is a cross-sectional view of a silicon photomultiplier detector cell according to some example embodiments.

FIG. 6 is a cross-sectional view of a silicon photomultiplier detector cell 200 according to some example embodiments. Since the structure of a photodiode having improved photo detection efficiency is focused on in some example embodiments, components other than the photodiode of the silicon photomultiplier detector cell 200 will not be described herein. For convenience of explanation, the structure of the silicon photomultiplier detector cell 200 is divided into a photodiode region D and a readout circuit region R, and only complementary metal-oxide-semiconductor (CMOS) layers 330 and 340 in the readout circuit region R are illustrated.

Referring to FIG. 6, the silicon photomultiplier detector cell 200 may be divided into the photodiode region D and the readout circuit region R on a substrate 210. The substrate 210 may be an n-type or p-type silicon substrate. Since the substrate 210 may be a substrate that conforms to the standards of CMOS devices of the readout circuit region R, the readout circuit region R and the photodiode region D may be on the same substrate 210. Hereinafter, the substrate 210 is set to be a silicon substrate doped with p-type impurities, for convenience of explanation.

The silicon photomultiplier detector cell 200 may include a trench 250 formed deeply toward the substrate 210, so as to separate the photodiode region D from the readout circuit region R. The trench 250 may extend from the surface of the silicon photomultiplier detector cell 200 to the substrate 210. The trench 250 may be filled with material(s) having a function of electrical and optical shielding between the photodiode region D and the readout circuit region R. For example, the trench 250 may be filled with an insulative material. In detail, a first insulation film 252 enabling electrical insulation may be formed in a region of the trench 250 that contacts the photodiode region D, the readout circuit region R, the substrate 210, and the outside of the silicon photomultiplier detector cell 200, and the first insulation film 252 may be filled with a film 254 capable of reducing or preventing optical crosstalk. The film 254 capable of reducing or preventing optical crosstalk may be a polysilicon film or a metal film. The polysilicon film or the metal film may not only reduce or prevent optical crosstalk, but also may play the role of a field plate.

The photodiode region D may include a first semiconductor layer 220, which is exposed to the surface of the silicon photomultiplier detector cell 200 and doped with first type impurities, a second semiconductor layer 230 doped with second type impurities, and a first epitaxial layer 240, which is disposed between the first and second semiconductor layers 220 and 230 and doped with the first type impurities. The photodiode region D may be formed of silicon, and may be doped with p-type or n-type impurities depending on the type of semiconductor layer.

The first semiconductor layer 220 may be a silicon layer doped with p-type impurities. The impurity concentration of the first semiconductor layer 220 may be equal to or greater than that of the substrate 210. The second semiconductor layer 230 may be a silicon layer doped with n-type impurities. The impurity concentration of the second semiconductor layer 230 may be equal to or greater than that of the first semiconductor layer 220. The first epitaxial layer 240 may be disposed between the first semiconductor layer 220 and the second semiconductor layer 230 and may be formed on the second semiconductor layer 230 in a straight growth manner. The first epitaxial layer 240 may contain p-type impurities, which are the same type of impurities as the first semiconductor layer 220.

A contact layer 270, which is disposed between the trench 250 and the first epitaxial layer 240 and contacts the second semiconductor layer 230, may be further disposed in the photodiode region D. The contact layer 270 may be doped with the same type of impurities as the second semiconductor layer 230, and the impurity concentration of the contact layer 270 may be less than that of the second semiconductor layer 230.

A second insulation film 280 may be further disposed on a part of the surface of the silicon photomultiplier detector cell 200 between the first semiconductor layer 220 and the contact layer 270. The second insulation film 280 may reduce or prevent electrical leakage between the first semiconductor layer 220 and the contact layer 270. The second insulation film 280 may be formed of silicon nitride or silicon oxide. As illustrated in FIG. 6, the first epitaxial layer 240 is defined by the first and second semiconductor layers 220 and 230, the contact layer 270, and the second insulation film 280.

The first semiconductor layer 220 may be connected an anode electrode, and the second semiconductor layer 230 may be connected to a cathode electrode via the contact layer 270.

Photo detection efficiency may be determined by a light-incidence area (i.e., a fill factor), quantum efficiency, and an avalanche triggering probability that an avalanche is triggered while an electron or a hole generated from light is being accelerated by an electric field within a depletion region.

As illustrated in FIG. 6, since the second semiconductor layer 230 is disposed across the photodiode region D, an area where an avalanche occurs and an overlap area between the first and second semiconductor layers 220 and 230 are large. Thus, photo detection efficiency may be increased. Since the first and second semiconductor layers 220 and 230 perform a photodiode function and only the first epitaxial layer 240 is formed therebetween, a thickness of the first epitaxial layer 240, namely, a depletion width, is large. Thus, electrons produced from light undergo more impact ionizations while moving across the depletion width, and thus more electrons and holes are additionally produced. This leads to a high avalanche triggering probability, thus increasing the photo detection efficiency.

A second epitaxial layer 290 may be formed between the substrate 210 and the second semiconductor layer 230. The second epitaxial layer 290 may be doped with a different type of impurities from the impurity type of the second semiconductor layer 230. For example, the second epitaxial layer 290 may be doped with p-type impurities. Therefore, a current in the second semiconductor layer 230 may be prevented from leaking into the readout circuit region R or such leakage may be reduced.

In addition, since an epitaxial layer 310 is exposed to the outside of the silicon photomultiplier detector cell 200 in the readout circuit region R, a bias voltage may be applied to the substrate 210 via the upper surface of the silicon photomultiplier detector cell 200.

Various circuit devices may be stacked in the readout circuit region R. For convenience of explanation, the two CMOS layers 330 and 340 are illustrated in FIG. 6.

FIGS. 7A through 7H are cross-sectional views illustrating a method of fabricating the silicon photomultiplier detector cell 200 of FIG. 6.

Figure 7A:
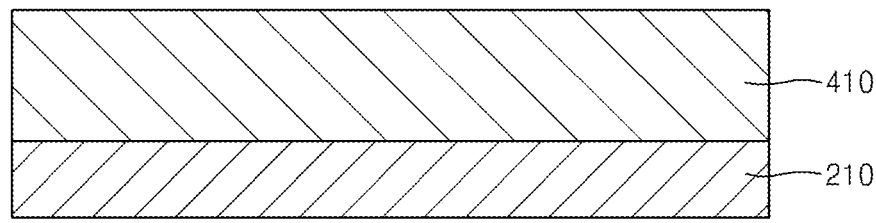
FIGS. 7A through 7H are cross-sectional views illustrating a method of fabricating the silicon photomultiplier detector cell illustrated in FIG. 6.

Referring to FIG. 7A, a first layer 410 is grown on the substrate 210. The substrate 210 may be a silicon layer doped with p-type impurities. The first layer 410 may also be doped with p-type impurities. The first layer 410 may be formed by epitaxially growing p-type silicon having a low doping concentration via chemical vapor deposition (CVD). The first layer 410 may be commonly used to form a device of a readout circuit region, for example, a CMOS. Thus, the thickness of the first layer 410 may be similar to a thickness required to form a device of the readout circuit region R. Since such an layer epitaxially grown across the substrate 210 may be used as a base member for forming a photodiode and a readout circuit, a photodiode and a signal processing device may be simultaneously formed.

Figure 7B:
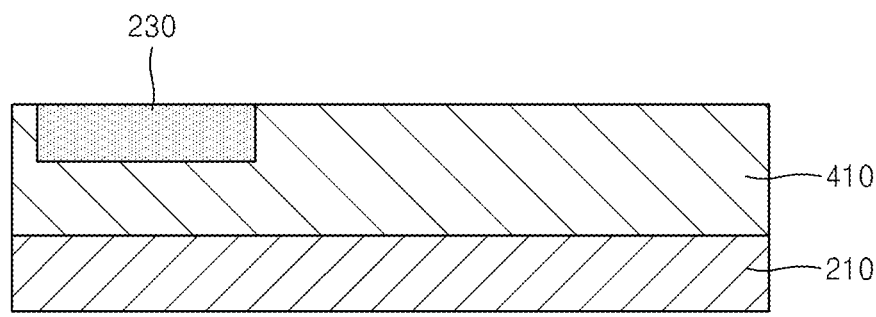

As illustrated in FIG. 7B, the second semiconductor layer 230 is formed in a part of the first layer 410. To form the second semiconductor layer 230, silicon doped with p-type impurities may be epitaxially grown by ion implantation or ion diffusion. The second semiconductor layer 230 may be a shallow isolation layer.

Figure 7C:
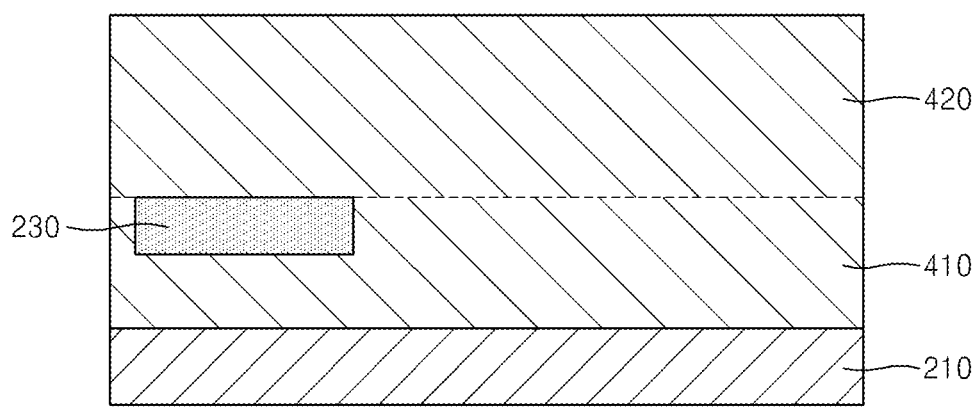

As illustrated in FIG. 7C, a second layer 420 may be additionally grown on the first layer 410 such as to cover the second semiconductor layer 230. The second layer 420 may be doped with p-type impurities, and the impurity concentration of the second layer 420 may be equal to that of the first layer 410. Thus, the second layer 420 formed on the first layer 410 may not be separated from the first layer 410.

Figure 7D:
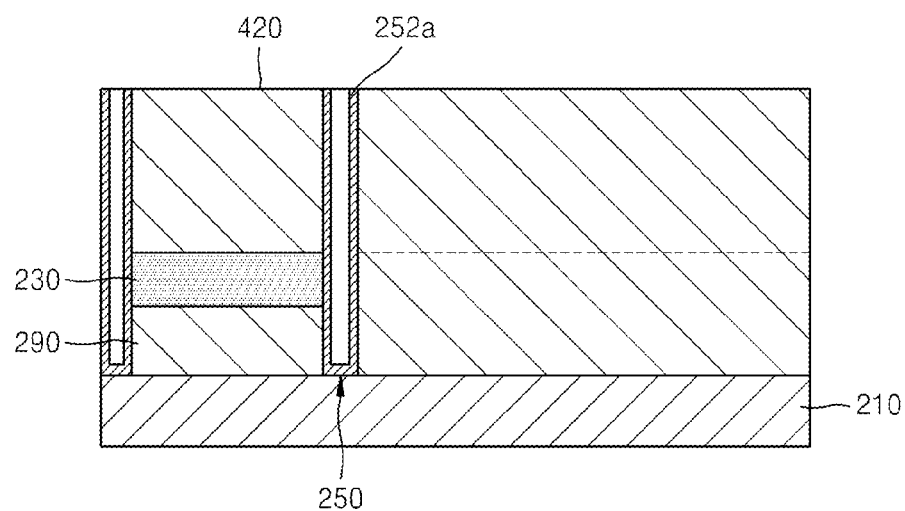

As illustrated in FIG. 7D, to divide the silicon photomultiplier detector cell 200 into the photodiode region D and the readout circuit region R, the trench 250 is formed by etching the first and second layers 410 and 420 by a desired width (that may or may not be predetermined). The trench 250 may be formed by etching the first and second layers 410 and 420 so that the substrate 210 is exposed. In some cases, a part of the substrate 210 may be etched. Due to the formation of the trench 250, a part of the first layer 410 between the second semiconductor layer 230 and the substrate 210 becomes the second epitaxial layer 290. A part of the second layer 420 on the second semiconductor layer 230 may be the first epitaxial layer 240.

An insulation film 252a may be formed on a side wall of the trench 250. The insulation film 252a may not only help formation of the contact layer 270, which will be described later, but also insulate the photodiode region D from the readout circuit region R. The insulation film 252a may be also formed on a lower surface of the trench 250.

Figure 7E:
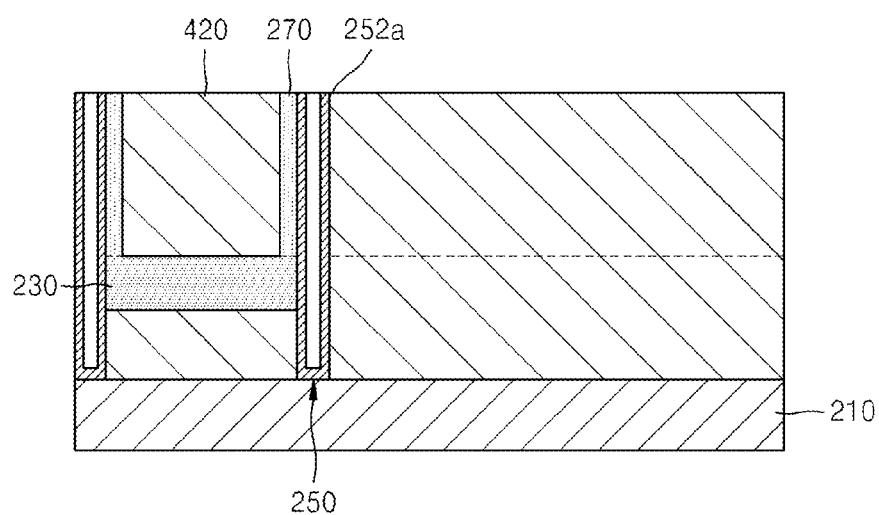

As illustrated in FIG. 7E, the contact layer 270 may be formed by implantation. The contact layer 270 may be formed along the insulation film 252a while contacting the second semiconductor layer 230, and may be exposed to the outside. The contact layer 270 may be doped with the same type of impurities as those of the second semiconductor layer 230, but the impurity concentration of the contact layer 270 may be less than that of the second semiconductor layer 230.

Figure 7F:
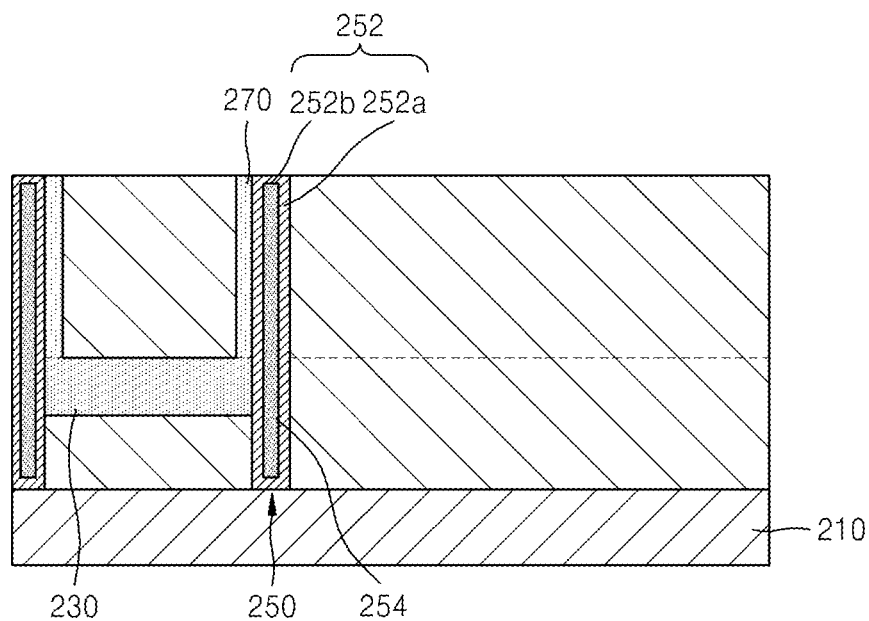

As illustrated in FIG. 7F, the film 254 capable of reducing or preventing optical crosstalk may be formed by filling the trench 250 with polysilicon, and then an exposed part of the film 254 capable of reducing or preventing optical crosstalk may be covered with an insulation film 252b. The film 254 capable of reducing or preventing optical crosstalk may reduce or prevent optical crosstalk between the photodiode region D and the readout circuit region R. The trench 250 may be filled with a material other than polysilicon as long as the material is capable of reducing or preventing optical crosstalk. For example, the trench 250 may be filled with metal instead of polysilicon. The polysilicon or metal may not only reduce or prevent optical crosstalk, but also serve as a field plate. The insulation film 252b formed on the surface of the film 254 capable of reducing or preventing optical crosstalk may insulate the photodiode region D from the readout circuit region R. The first insulation film 252 including the insulation films 252a and 252b may be a silicon oxide film or a silicon nitride film. The first insulation film 252 may not only perform an insulation function but also reflect incident light.

Figure 7G:
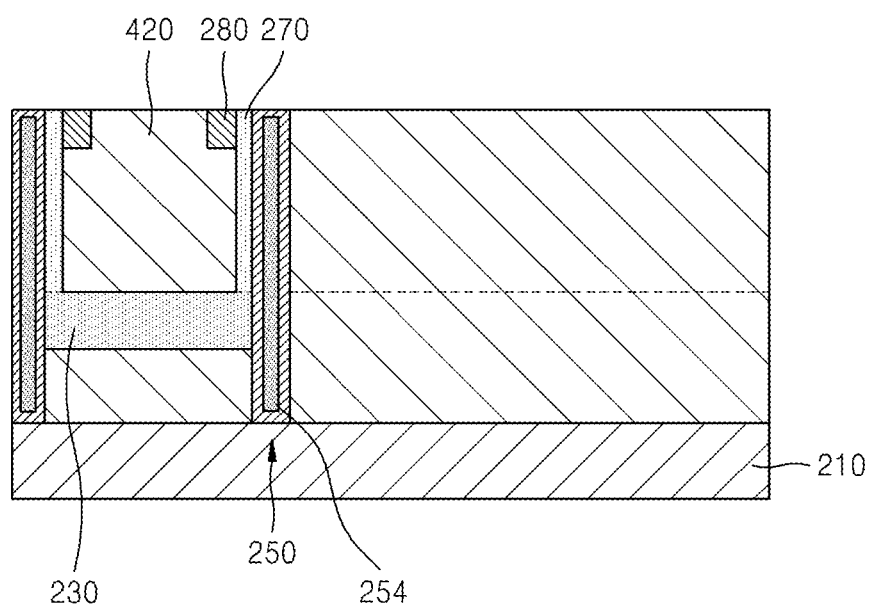

As illustrated in FIG. 7G, the second insulation film 280 may be formed in contact with the contact layer 270 in order to electrically separate the first semiconductor layer 220, which will be formed later, from the contact layer 270. The second insulation film 280 may be a silicon oxide film or a silicon insulation film.

Figure 7H:
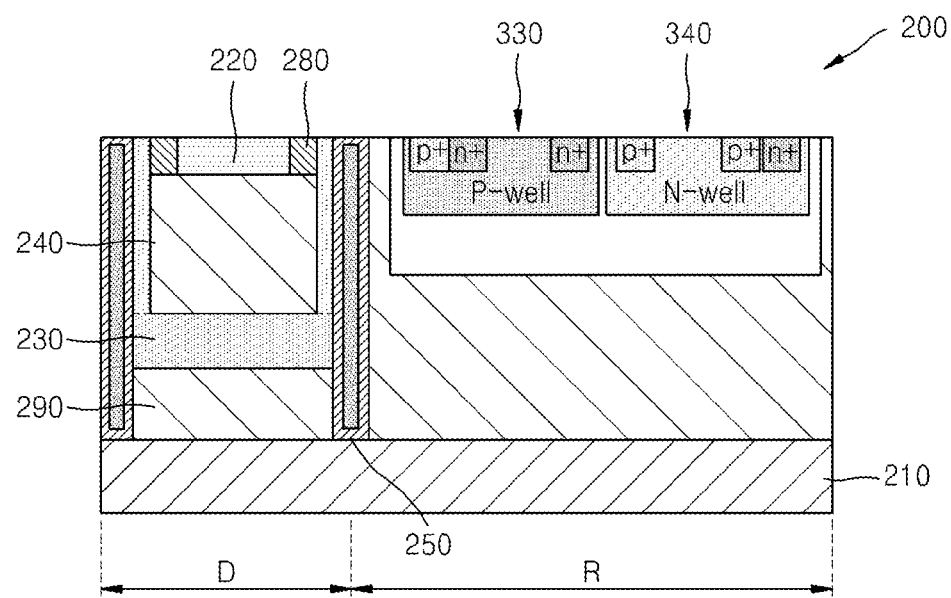

As illustrated in FIG. 7H, the first semiconductor layer 220 may be formed by doping an exposed part of the second layer 420 with n-type impurities. The impurity type of the first semiconductor layer 220 may be opposite to that of the second semiconductor layer 230, and the impurity concentration of the first semiconductor layer 220 may be less than that of the second semiconductor layer 230. A part of the second layer 420 between the first and second semiconductor layers 220 and 230 may be the first epitaxial layer 240. In the readout circuit region R, necessary layers may be formed. As illustrated in FIG. 7H, the two CMOS layers 330 and 340 may be formed.

Figure 8:
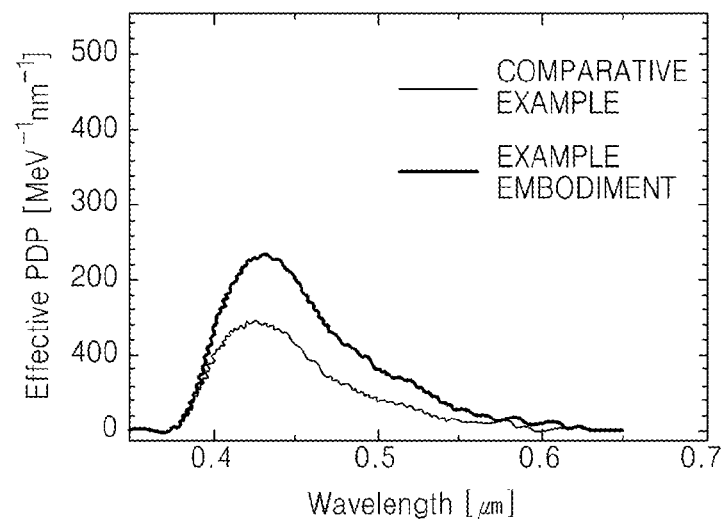
FIG. 8 shows a result of an experiment for detecting photo detection efficiency according to the structures of silicon photomultiplier detector cells.

In order to check photo detection efficiency, a comparative example having a diode region in which a p-type first semiconductor layer, an n-type second semiconductor layer, an n-type first epitaxial layer, an n-type third semiconductor layer, a p-type second epitaxial layer, a p-type substrate are formed from the surface of the diode region was set, and a silicon photomultiplier detector cell according to some example embodiments including a p-type first semiconductor layer, a p-type first epitaxial layer, an n-type second semiconductor layer, a p-type second epitaxial layer, and a p-type substrate was set. FIG. 8 shows experimental data obtained by detecting photo detection efficiency depending on the structures of silicon photomultiplier detector cells. Referring to FIG. 8, the photo detection efficiency of the silicon photomultiplier detector cell according to some example embodiments is about 1.6 times greater than that of the comparative example. When considering up to a fill factor, the photo detection efficiency of the silicon photomultiplier detector cell according to some example embodiments may be further increased.

A silicon photomultiplier detector cell according to some example embodiments may measure the amount of radiation without regard to the capacity of memory because the radiation is counted in real time, thereby increasing energy resolution.

A silicon photomultiplier detector cell according to some example embodiments may not only improve energy resolution and time resolution of a detector by increasing photo detection efficiency, but also improve the contrast of tumoral tissue or the like and the accuracy of the position of tumoral tissue or the like.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A silicon photomultiplier detector cell including a photodiode region and a readout circuit region formed on a same substrate, the photodiode region comprising:
   a first semiconductor layer exposed on a surface of the silicon photomultiplier detector cell and doped with p-type impurities;
   a second semiconductor layer doped with n-type impurities and not exposed on the surface of the silicon photomultiplier detector cell; and
   a first epitaxial layer doped with the p-type impurities at a concentration lower than a concentration of the p-type impurities of the first semiconductor layer and lower than a concentration of the n-type impurities of the second semiconductor layer;
   wherein only the first epitaxial layer is between the first semiconductor layer and the second semiconductor layer, and
   wherein avalanche occurs only in the first epitaxial layer.

2. The silicon photomultiplier detector cell of claim 1, wherein a concentration of the n-type impurities of the second semiconductor layer is greater than the concentration of the p-type impurities of the first semiconductor layer.

3. The silicon photomultiplier detector cell of claim 1, further comprising:
   a second epitaxial layer between the same substrate and the second semiconductor layer;
   wherein the second epitaxial layer is doped with the p-type impurities at a concentration lower than the concentration of the p-type impurities of the first semiconductor layer.

4. The silicon photomultiplier detector cell of claim 3, wherein the concentration of the p-type impurities of the second epitaxial layer is equal to the concentration of the p-type impurities of the first epitaxial layer.

5. The silicon photomultiplier detector cell of claim 1, wherein the same substrate is a silicon layer doped with the p-type impurities.

6. The silicon photomultiplier detector cell of claim 1, wherein a trench extending from a surface of the silicon photomultiplier detector cell to the same substrate is formed between the photodiode region and the readout circuit region.

7. The silicon photomultiplier detector cell of claim 6, wherein the trench is filled with material configured to reduce or prevent optical crosstalk.

8. The silicon photomultiplier detector cell of claim 6, wherein the trench is filled with at least one of polysilicon and metal.

9. The silicon photomultiplier detector cell of claim 6, wherein a first insulation film is formed on a sidewall of the trench.

10. The silicon photomultiplier detector cell of claim 6, further comprising:
    a contact layer between the trench and the first epitaxial layer;
    wherein the contact layer contacts the second semiconductor layer.

11. The silicon photomultiplier detector cell of claim 10, wherein the contact layer is doped with the n-type impurities at a concentration lower than the concentration of the n-type impurities of the second semiconductor layer.

12. The silicon photomultiplier detector cell of claim 10, further comprising:
    a second insulation film between the first semiconductor layer and the contact layer.

13. A method of fabricating a silicon photomultiplier detector cell including a photodiode region and a readout circuit region formed on a same substrate, the method comprising, in order to form the photodiode region:
    forming a first semiconductor layer doped with p-type impurities on a first layer;
    forming, via epitaxial growth, a second layer doped with the p-type impurities on the first semiconductor layer; and
    forming a second semiconductor layer doped with n-type impurities on the first layer.

14. The method of claim 13, further comprising:
    forming the second layer doped with the p-type impurities on the same substrate.

15. The method of claim 14, further comprising:
    forming a trench that exposes the same substrate, by etching the first layer and the second layer, after forming the second layer.

16. The method of claim 15, further comprising:
    forming a first insulation film on a sidewall of the trench; and
    filling the trench with material configured to reduce or prevent optical crosstalk.

17. The method of claim 16, wherein the material that reduces or prevents optical crosstalk comprises at least one of polysilicon and metal.

18. The method of claim 16, further comprising:
    forming a contact layer, doped with the p-type impurities, in parts of the second layer that contact the trench.

19. The method of claim 18, further comprising:
    forming an insulation film configured to insulate the first semiconductor layer from the contact layer, before forming the second semiconductor layer.

* * * * *